United States Patent
Ishii et al.

(10) Patent No.: US 11,019,324 B2
(45) Date of Patent: May 25, 2021

(54) STEREO CAMERA

(71) Applicant: HITACHI AUTOMOTIVE SYSTEMS, LTD., Hitachinaka (JP)

(72) Inventors: Mieko Ishii, Tokyo (JP); Atsushi Kazama, Tokyo (JP); Seiichi Katou, Tokyo (JP); Kengo Suzuki, Tokyo (JP); Hidenori Shinohara, Hitachinaka (JP); Hiroaki Nagai, Hitachinaka (JP); Kenichi Takeuchi, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 16/470,639

(22) PCT Filed: Dec. 21, 2017

(86) PCT No.: PCT/JP2017/045873
§ 371 (c)(1),
(2) Date: Jun. 18, 2019

(87) PCT Pub. No.: WO2018/128083
PCT Pub. Date: Jul. 12, 2018

(65) Prior Publication Data
US 2019/0320159 A1    Oct. 17, 2019

(30) Foreign Application Priority Data

Jan. 6, 2017   (JP) ............................. JP2017-000967

(51) Int. Cl.
*H04N 13/239*   (2018.01)
*H04N 5/225*    (2006.01)
(Continued)

(52) U.S. Cl.
CPC ......... *H04N 13/239* (2018.05); *H04N 5/2252* (2013.01); *H04N 5/2258* (2013.01); *H05K 7/2039* (2013.01)

(58) Field of Classification Search
CPC .. H04N 13/239; H04N 5/2252; H04N 5/2258; H04N 7/183; H05K 7/2039;
(Continued)

(56) References Cited

U.S. PATENT DOCUMENTS

2005/0001901 A1* 1/2005 Eggers .................. B60R 11/04
                                                        348/118
2012/0050608 A1   3/2012 Makara
(Continued)

FOREIGN PATENT DOCUMENTS

JP            3148749 B     3/2001
JP        2009-100174 A     5/2009
(Continued)

OTHER PUBLICATIONS

International Search Report with English translation and Written Opinion issued in corresponding application No. PCT/JP2017/045873 dated Apr. 24, 2018.

*Primary Examiner* — Alexander Gee
(74) *Attorney, Agent, or Firm* — Foley & Lardner LLP (57) ABSTRACT

The present invention provides a highly reliable stereo camera in which it is possible to prevent the heat generated by an image processing element from contributing to an increase in the temperature of an image sensor, even if the stereo camera is made more compact and the heat density is thus increased inside the stereo camera. The present invention includes: a pair of image sensors 106 that have respective imaging elements disposed at the same height with a space therebetween; image processing elements 109 that are disposed between the image sensors and process image signals captured by the image sensors 106; a casing 105 that (Continued)

has the image processing elements and the image sensors incorporated therein, and in the area between the image sensors, has an inclined surface that is inclined from the image sensors 106 downward toward the imaging direction of the image sensors 106; an airflow path 301 that is defined so as to extend along the inclined surface of the casing 105 toward the imaging direction; and heat dissipating parts 120 that are thermally connected to the respective image processing elements 109 and disposed on the inclined surface so as to face the airflow path.

14 Claims, 7 Drawing Sheets

(51) Int. Cl.
    *H05K 7/20*    (2006.01)
    *B60R 1/00*    (2006.01)
    *H01L 23/40*    (2006.01)
    *H01L 23/467*    (2006.01)
    *G03B 15/00*    (2021.01)
    *G03B 17/02*    (2021.01)
    *G03B 17/55*    (2021.01)

(58) Field of Classification Search
    CPC .......... B60R 1/00; B60R 1/002; B60R 1/007; B60R 11/04; B60R 2300/00; B60R 2300/107; B60R 2011/0026; B60R 2011/0003

See application file for complete search history.

(56) References Cited

U.S. PATENT DOCUMENTS

| | | | |
|---|---|---|---|
| 2013/0208120 A1* | 8/2013 | Hirai | G06K 9/00825 348/148 |
| 2015/0015713 A1* | 1/2015 | Wang | H04N 7/18 348/148 |
| 2016/0006911 A1* | 1/2016 | Kimura | H04N 13/239 348/47 |
| 2016/0227079 A1* | 8/2016 | Oh | H04N 5/372 |
| 2016/0257261 A1* | 9/2016 | Kageyama | B60R 11/04 |
| 2016/0264056 A1* | 9/2016 | Uken | B60R 11/04 |
| 2017/0334365 A1* | 11/2017 | Ikeno | H04N 7/183 |

FOREIGN PATENT DOCUMENTS

| | | |
|---|---|---|
| JP | 2012-49613 A | 3/2012 |
| JP | 2016-14564 A | 1/2016 |

\* cited by examiner

STEREO CAMERA

TECHNICAL FIELD

The present invention relates to a stereo camera that is arranged in the vicinity of the windshield of a vehicle and mounted in a car to obtain surrounding environmental data during running.

BACKGROUND ART

In recent years, there has been proposed a drive assistance system or the like in which an imaging device is mounted on a vehicle, information for safety running is provided to a driver on the basis of surrounding environmental data during running of the vehicle acquired by the imaging device, or vehicle control is automatically performed on the basis of the information.

As the aforementioned imaging device, for example, a vehicular camera is known that adopts a technology in which, for example, a distance to an imaging subject is measured by a pair of image sensors arranged right and left to avoid collision with a front vehicle or the like.

As disclosed, for example, in PTL 1, the vehicular camera is often arranged in the vicinity of the windshield of a vehicle such that the temperature tends to increase due to sunlight, heat generated inside the device, or the like.

When the temperature of an inside component exceeds an upper limit temperature, there is a concern that a malfunction occurs, the lifetime of the component is shortened, or the like. Therefore, PTL 1 proposes a structure in which the vehicular camera is covered with a cover member with a clearance and the cover member has a vent hole for venting air-conditioning air such that the temperature around the vehicular camera can quickly be returned to normal temperature even at a time of high temperature in summer seasons or at a time of low temperature in winter seasons.

In addition, for example, PTL 2 discloses an imaging unit including a plurality of monocular cameras, a casing for supporting the monocular cameras, and a circuit board, e.g., a camera imaging element substrate and an image processing substrate, within the casing, including a heat dissipating structure including a heat transfer member that is provided in contact with the casing or the circuit board, in which the heat transfer member contacts the windshield such that the heat in the casing and a casing part is transferred to the windshield to reduce the temperature of the inside component.

CITATION LIST

Patent Literature

PTL 1: JP 3148749 B1
PTL 2: JP 2016-14564 A

SUMMARY OF INVENTION

Technical Problem

The conventional technology described in PTL 1 is described to indicate that the vehicular camera is covered with the cover member having the vent hole, there is a clearance between the cover member and the camera, and environmental stresses such as sunlight or heat can be avoided by the vent hole of the cover member and by heat transfer to the chassis.

However, the vehicular camera described in PTL 1 is described to refer to a heat insulating effect of the cover member from external solar radiation heat or a heat transfer effect from the chassis to a front rail of the vehicle body, but is not described to refer to a structure of dissipating the heat amount generated by the component inside the vehicular camera to the outside in an arrangement state other than the above, i.e., arrangement on the windshield, or the like.

In recent years, the vehicular camera has increasingly been used in a drive assistance system or an automatic drive technology for enhanced safety, and has also been increased in penetration rate. Therefore, mounting even on a small-sized car or a light automobile has been increased, and thus a reduction in size and a reduction in cost are issues. However, a reduction in size of the vehicular camera does not reduce power consumption of the camera itself, but reduces the volume of the camera, resulting in a concern that the heat density is increased and the temperature inside the camera is increased.

When the temperature inside the camera is increased, a failure or a reduction in lifetime of an inside component, e.g., a circuit element, tends to occur. In particular, in the case of an imaging element, e.g., CMOS, which is important for a camera, it is often the case that an upper limit temperature is low. When the temperature is exceeded, there is a high possibility that a failure, e.g., normal operation is not provided, occurs.

Accordingly, with the aforementioned structure only, there is a possibility that the operation of the camera during a hot period in summertime cannot be ensured.

In addition, according to the conventional technology described in PTL 2, the heat of the circuit board and the casing part of the imaging unit is transferred by the heat transfer member contacting the windshield to reduce the internal temperature. Meanwhile, there is a concern that when the temperature of the windshield is increased by solar radiation, the heat amount of the glass is transferred to the imaging unit and the temperature is increased. There is a problem that according to the invention of PTL 2, it is difficult to obtain a heat dissipating effect during a hot period in summertime.

The present invention propose a heat dissipating structure that solves the aforementioned problem and, even when the inside heat density is increased by a reduction in size, effectively releases the heat of a component in a stereo camera to the outside to retain the temperature inside the device within a range of an operation assurance temperature.

Solution to Problem

In order to solve the problem, a stereo camera of the present invention includes: a pair of image sensors that have respective imaging elements disposed at a same height with a space therebetween; image processing elements that are disposed between the image sensors and process image signals captured by the image sensors; a casing that has the image processing elements and the image sensors incorporated therein; in an area between the image sensors, an inclined surface that is inclined from the image sensors downward toward an imaging direction of the image sensors; an airflow path that is defined so as to extend along the inclined surface of the casing toward the imaging direction; and heat dissipating parts that are thermally connected to the respective image processing elements and disposed on the inclined surface so as to face the airflow path.

Furthermore, according to the present invention, the image processing element is disposed on an inner side relative to the image sensors in a direction between the image sensors.

Furthermore, according to the present invention, a heat transfer member is provided at a contact portion between the image processing element and the heat dissipating part.

Furthermore, according to the present invention, the heat dissipating part has a fin structure that is provided along the airflow path.

Furthermore, according to the present invention, airflow that passes the heat dissipating part is separated from airflow that passes over the image sensor.

Furthermore, according to the present invention, the inclined surface on which the heat dissipating part is arranged includes a recessed portion that brings the casing closer to the image processing element.

Furthermore, according to the present invention, the inclined surface is extended to a casing part on a back surface of the image sensor, and the heat dissipating part of the recessed portion is formed across the entire inclined surface.

Furthermore, according to the present invention, the heat dissipating part of the recessed portion is formed to have a width that widens from below to above the inclined surface.

Furthermore, according to the present invention, a heat insulating member that separates a central part of the casing from a surrounding part of right and left image sensors is arranged on the casing.

Furthermore, according to the present invention, the casing is covered with a cover member having an aperture and is disposed in a vicinity of a windshield of a vehicle.

Furthermore, according to the present invention, an airflow path is formed between the inclined surface of the casing and the cover member.

Furthermore, according to the present invention, a light shielding member is formed on a surface of the cover member facing the windshield.

Furthermore, according to the present invention, an airflow path is formed between the stereo camera and the light shielding member and between the light shielding member and the windshield.

Furthermore, according to the present invention, a position adjustment mechanism is arranged on the cover member.

Advantageous Effects of Invention

According to the present invention, it is possible to provide a highly reliable stereo camera in which even when the stereo camera is reduced in size, the heat of the image processing substrate and the image processing element can be effectively released to the outside for heat dissipation, and an increase in temperature of the image sensor due to influences of the heat can be suppressed.

DESCRIPTION OF EMBODIMENTS

First Embodiment

Examples are described below according to the drawings.

A first example of a stereo camera 100 of the present invention is described in conjunction with FIGS. 1 to 11. Like numbers indicate like parts throughout the drawings.

Figure 1:
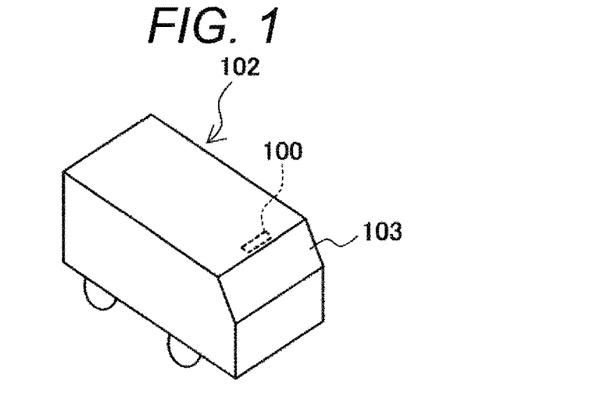
FIG. 1 is a view schematically illustrating an overall configuration of a vehicle in which a stereo camera according to a first embodiment is arranged.

FIG. 1 illustrates an arrangement position in which the stereo camera 100 of the present invention is arranged on a vehicle 102.

Figure 2:
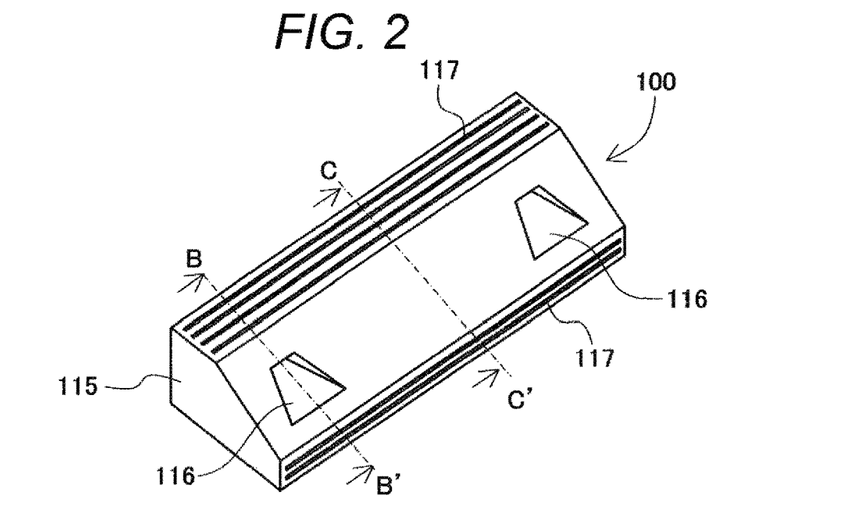
FIG. 2 is a perspective view illustrating a cover member according to the first embodiment.

The stereo camera 100 is closely disposed to be accommodated in a cover member 115 illustrated in FIG. 2 near the center in the vicinity of an upper part of a windshield 103 of the vehicle 102. Note that in the following description the stereo camera in a state of being surrounded by the cover member 115 is a component 100 and the stereo camera alone is a component 101.

FIG. 2 illustrates a perspective view of the cover member 115 in which the stereo camera 101 is arranged inside when mounted on a car. The stereo camera 101, for designability or a reduction in influence of external solar radiation, is arranged within the cover member 115 and is mounted in the vehicle 102 of FIG. 1.

Figure 3:
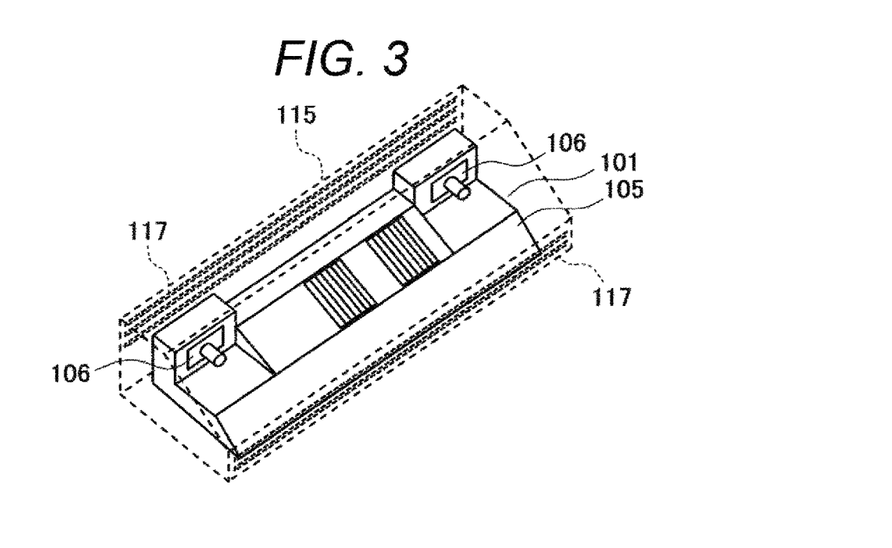
FIG. 3 is a transparent view schematically illustrating an overall configuration of the cover member and the stereo camera of FIG. 2.

FIG. 3 illustrates a perspective view of the stereo camera 101 that is accommodated within the cover member 115 illustrated in FIG. 2 and to which the present invention is applied. As illustrated in FIG. 3, the stereo camera 101 is configured to capture an external image with an image sensor 106 through an aperture 116.

Figure 4:
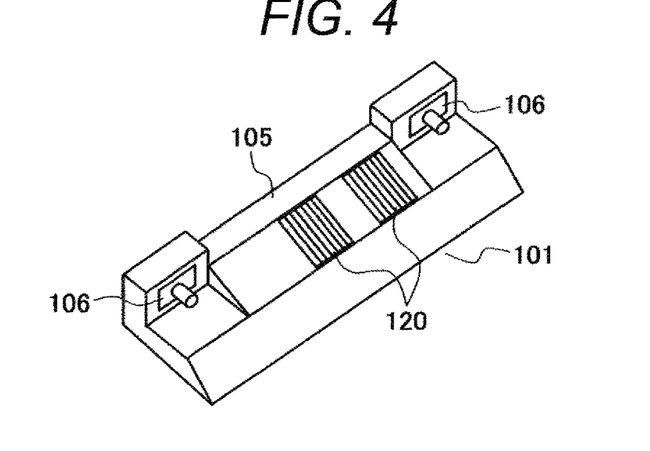
FIG. 4 is a perspective view illustrating an external appearance of the stereo camera according to the first embodiment.
Figure 5:
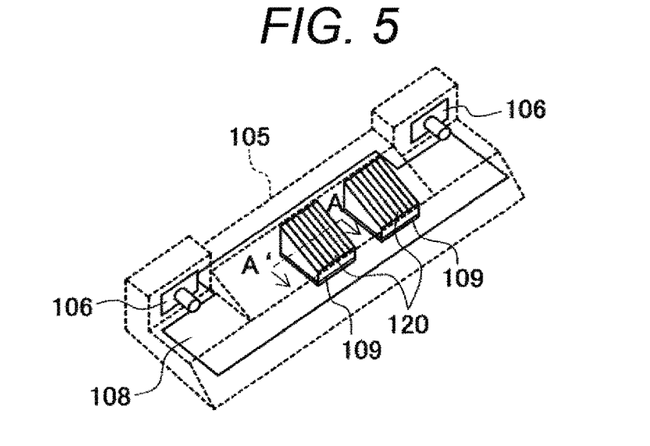
FIG. 5 is a transparent view illustrating an internal structure of the stereo camera of FIG. 4.
Figure 6:
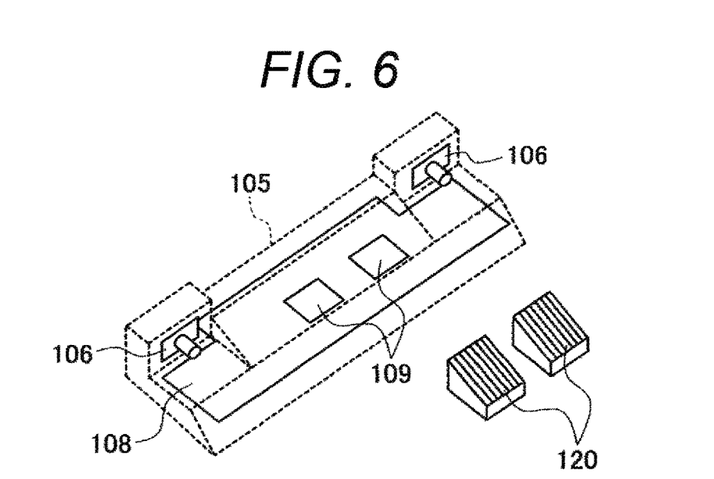
FIG. 6 is an internal structural view illustrating a heat dissipating part of FIG. 4 as a separate body.
Figure 7:
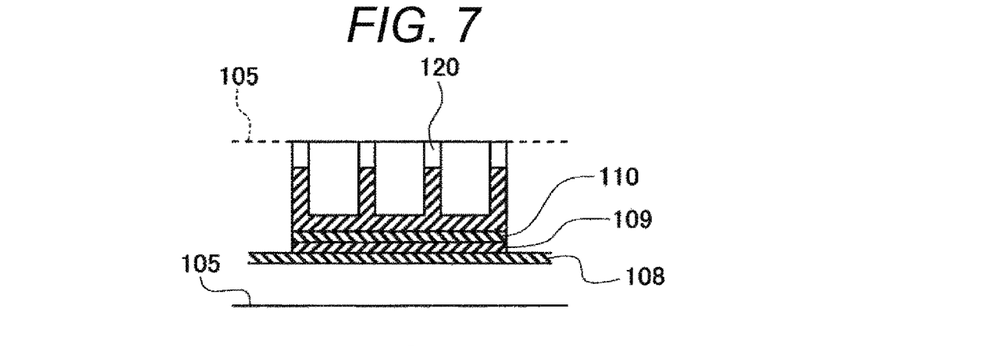
FIG. 7 is a cross-sectional view cut along A-A' of FIG. 5.

FIG. 4 illustrates an external appearance of the stereo camera 101 alone, FIG. 5 illustrates an internal configurational view, FIG. 6 illustrates an internal configurational view in which a heat dissipating part 120 is separated, and FIG. 7 illustrates an enlarged view of a contact portion between an image processing-grade element 109 and the heat dissipating part 120. Note that in FIGS. 5 and 6 the camera casing is transparently illustrated by the dotted line to show the internal structure.

As illustrated in the camera external appearance view of FIG. 4, in the stereo camera 101 of the present example, a pair of image sensors 106 is arranged on the right and left of the casing 105, and an image processing substrate 108 having a length exceeding a baseline length of the pair of image sensors 106 illustrated in FIG. 5 is incorporated in a front lower portion of the image sensors 106. The image processing substrate 108 is arranged between the image sensors 106, and a plurality of image processing-grade elements 109 is arranged on the substrate 108. The plurality of image processing elements 109 is configured, for example, of a microprocessor.

On an upper part of the image processing-grade element 109 illustrated in FIG. 6, the heat dissipating part 120 having a structure that is partially exposed to the outside is integrally formed with an upper inclined surface of the casing 105 as illustrated in FIGS. 4 and 5.

FIG. 7 illustrates a longitudinal cross-sectional view of A-A' cross-section of the heat dissipating part 120 illustrated in FIG. 4.

In FIG. 7, the image processing-grade element 109 is mounted on the image processing substrate 108 and contacts the heat dissipating part 120 via a heat transfer member 110, e.g., a heat transfer gel or a heat transfer sheet. The heat dissipating part 120 is integrally formed with the casing 105 and has a recessed portion in a portion that is exposed on the surface facing the casing 105. Furthermore, the recessed portion is formed to have a fin shape for air cooling.

Next, the operation of the stereo camera 101 is described on the basis of FIGS. 4 to 7. As described above, the stereo camera 101 of FIG. 4 is arranged in the vicinity of an upper part of the windshield 3 and acquires image data of the front side of the running vehicle with the image sensors 106 disposed on right and left. The aforementioned acquired image data is transmitted to and processed by the plurality of image processing-grade elements 109 mounted on the image processing substrate 108 illustrated in FIG. 6, is converted into a drive assistance data or the like, and is output to an external device (not illustrated) that controls an engine, a brake, or the like.

The stereo camera 101 that performs the aforementioned series of operations has a tendency to have increased power consumption year by year because of high functionality.

During the operation of the stereo camera 101, the temperature of the image sensor 106 and the image processing-grade element 109 is increased by heat generated depending on individual power consumption. The stereo camera 101 of the present invention has a structure in which air in the car is caused to pass through the fin shape of the heat dissipating part 120 and dissipates the heat of the image processing-grade element 109 to the outside and cools it, and the temperature in the stereo camera 101 is also reduced accordingly such that an increase in temperature of the image sensor 106 is prevented.

Next, a state of airflow in a case where the stereo camera 101 is arranged in the cover member 115 is described.

Figure 8:
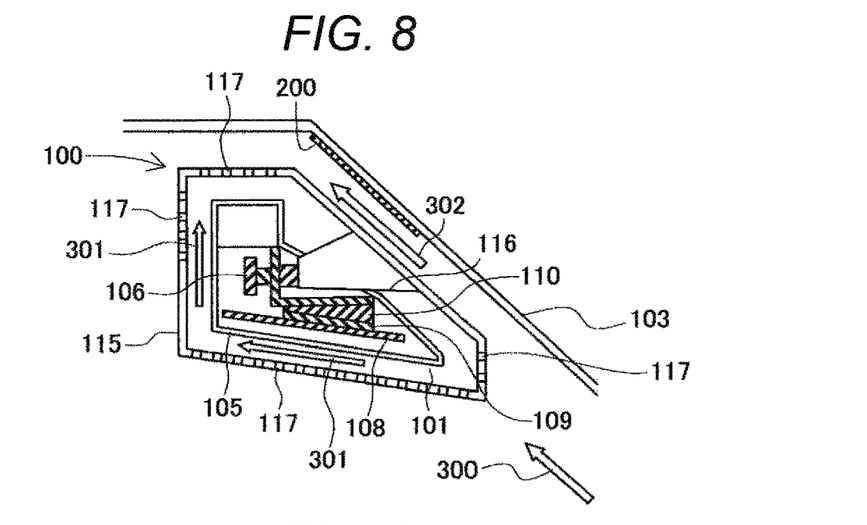
FIG. 8 is a view illustrating a cross-sectional view cut along B-B' of FIG. 2 together with a configuration of a vehicle on which the stereo camera is mounted.
Figure 9:
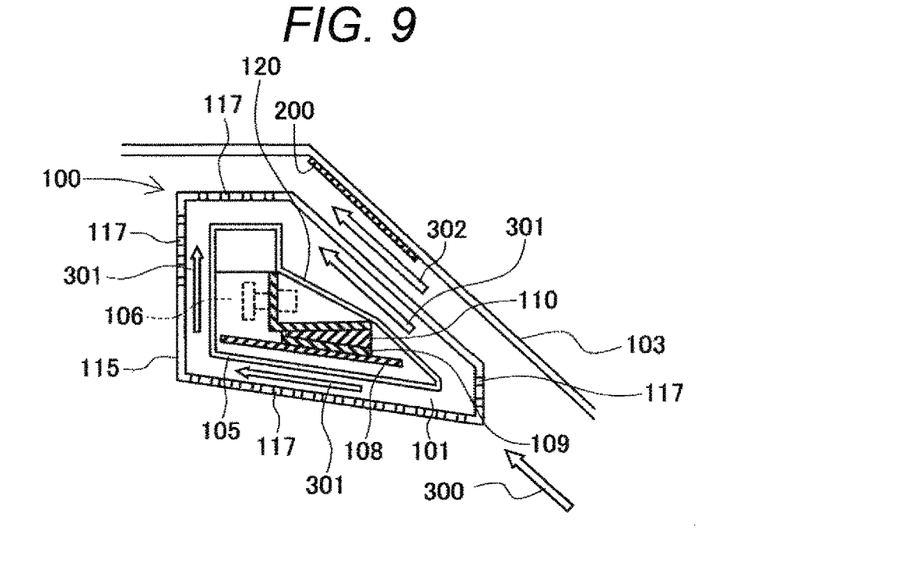
FIG. 9 is a view illustrating a cross-sectional view cut along C-C' of FIG. 2 together with a configuration of a vehicle on which the stereo camera is mounted.

FIG. 8 illustrates a cross-sectional view obtained when the cover member 115 illustrated in FIG. 2 is cut along B-B' cross-section at the center of the image sensor 106 of FIG. 2, and FIG. 9 illustrates a cross-sectional view obtained when the cover member 115 is cut along C-C' cross-section at the center of the camera. As illustrated in FIGS. 8 and 9, the periphery of the stereo camera 101 is covered with the cover member 115.

A further detailed description is given of environmental temperature and flow of airflow around the stereo camera 101 on the basis of FIGS. 8 and 9.

As illustrated in B-B' cross-section of FIG. 8, the stereo camera 101 is arranged within the cover member 115 in view of designability to make the stereo camera 101 hardly visible to a driver. The cover member 115 is formed, for example, of resin material, e.g., plastic, and includes an aperture 116 through a surface facing the windshield 103. The image data on the front side of the vehicle is captured through the aperture 116 by the image sensors 106 of the stereo camera 101 arranged within the cover member 115 so as not to be affected by the influences of sunlight. In addition, the cover member 115 is configured to include a slit 117, which is an aperture in a strip shape, on the front surface and the back surface such that airflow 300 from the outside is vented from a front lower part to a back upper part to cool the stereo camera 101 inside. Note that the slit 117 is not limited to the aforementioned shape and disposition.

Furthermore, on a surface of the windshield 103 near the camera, a black light shielding film 200, which is called black ceramic, is formed on an upper part of the windshield 103 in order to prevent entry of sunlight toward the stereo camera 101. The light shielding film 200 has very high temperatures when heated by solar radiation. Accordingly, the upper surface of the cover member 115 also serves to protect the stereo camera 101 from the heat generated by solar radiation of the light shielding film 200.

FIG. 9 illustrates C-C' cross-section at the center of the camera. Airflow 301 is described with reference to FIGS. 8 and 9.

For example, when a driver rides a car and the stereo camera 101 is turned on, in air in the cover member 115, internal air is warmed by heat of the stereo camera 101, and an upward airflow 301 is generated by chimney effect. In that case, air 300 in the car enters the cover member 115 as the airflow 301 through the slit 117 of the cover member 115 and passes around the stereo camera 101 to move to an upper back side of the cover member 115. When the airflow 301 passes and cools the fin formed on the heat dissipating part 120 illustrated in FIG. 5, an increase in temperature of the image processing element 109 is suppressed.

In addition, when an automotive air conditioner is activated, the temperature of the air 300 in the car is reduced by wind from the air conditioner. Moreover, when the wind is directed to an arrangement direction of the stereo camera 100 using a defroster or the like, the air 300 in the car becomes the airflow 301 and enters the cover member 115 through the slit 117 of the cover member 115, and passes through the periphery of the stereo camera 101 to move to an upper back side of the cover member 115. As compared with the case of natural air cooling, the rising speed of the airflow 301 is faster. Accordingly, when the airflow 301 passes and cools the fin of the heat dissipating part 120 illustrated in FIG. 5, the image processing element 109 can obtain a larger temperature reduction effect than the case of natural air cooling.

In addition, the air 300 in the car also inflows as the airflow 302 between the cover member 115 and the windshield 103 so as to be able to reduce the temperature, which has been increased by solar radiation, of an upper part of the cover member 115.

Figure 10:
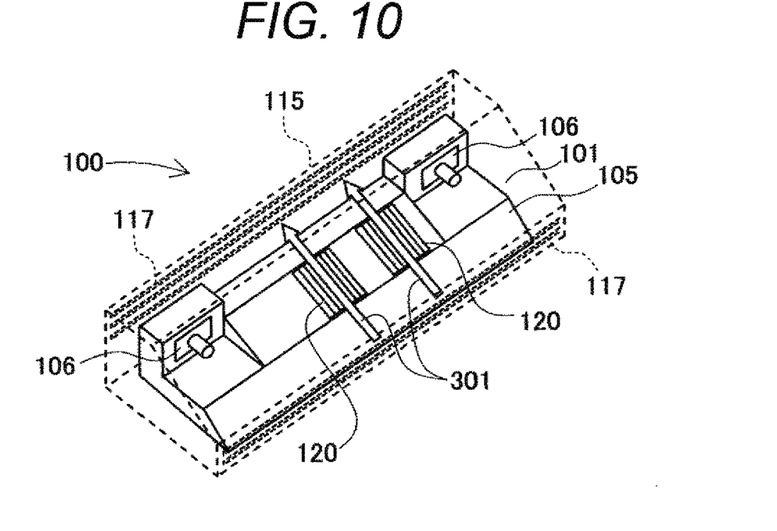
FIG. 10 is a perspective view illustrating an airflow in a cover member of a stereo camera with the cover member being transparent.
Figure 11:
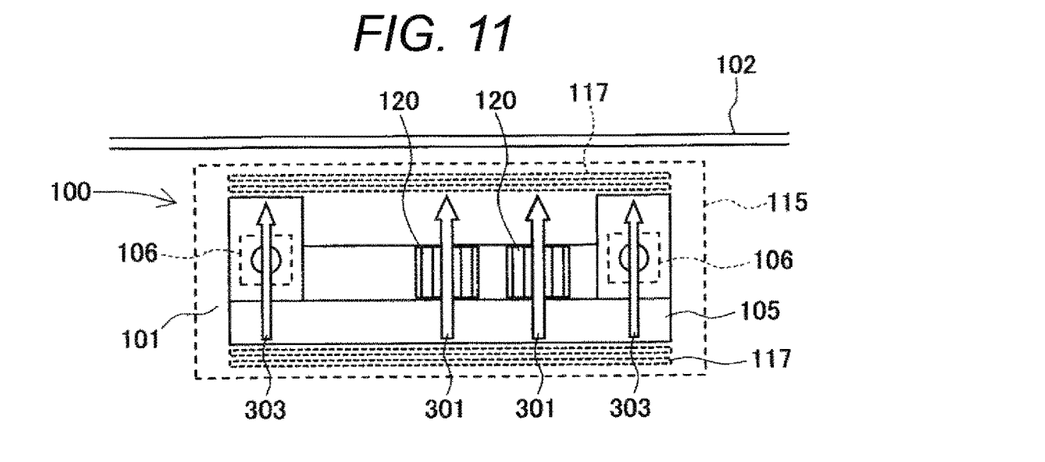
FIG. 11 is a front view corresponding to FIG. 10.

FIG. 10 is an explanatory view explaining in more detail a relationship between an element disposition and airflow in the stereo camera 100 of the present invention. FIG. 10 is a perspective view illustrating the stereo camera 100 in the cover member 115, and FIG. 11 is a front view of the stereo camera 100. In FIGS. 10 and 11, the cover member 115 is transparently illustrated and indicated by the dotted line.

As illustrated in FIGS. 10 and 11, it is structured such that the airflow 301 is formed from the slit 117 at the front lower portion to the slit 117 at the back upper portion in the stereo camera 101 in the cover member 115 and the airflow 301 flows to an upper part of the heat dissipating part 120. When the airflow path 301 is provided, it is possible, for example, to dispose the slit 117 at the back upper portion to have a larger area than the area of the slit 117 at the front lower portion such that the flow speed of the airflow 301 is increased. Alternatively, when a gap between the front surface of the stereo camera 101 and the cover member 115 is widened to the maximum possible extent, it is possible to obtain an effect of increasing the flow rate of the airflow 301 or the like such that the stereo camera 101 can be cooled effectively and an increase in temperature inside can be suppressed.

Figure 12:
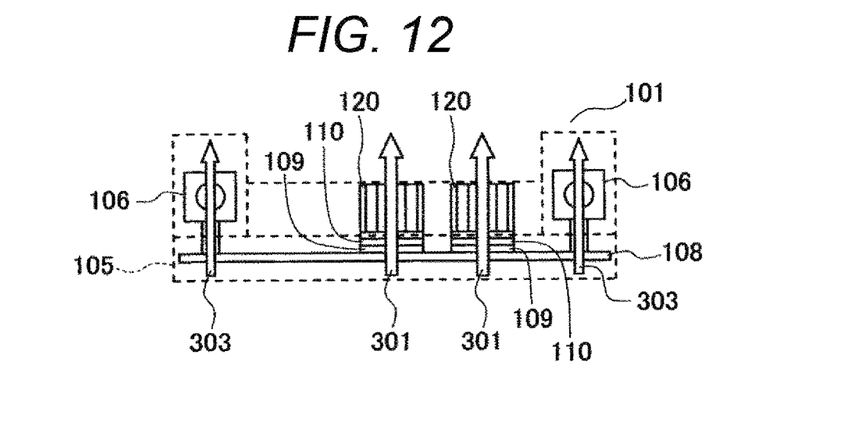
FIG. 12 is a front view transparently illustrating a stereo camera casing of FIG. 11.

FIG. 12 illustrates an internal configuration of the stereo camera 101 alone without the design cover 115 when viewed from the front side with the casing 105 being transparent.

As illustrated in FIG. 12, the image processing element 109 arranged on the image processing substrate 108 is disposed on an inner side relative to the image sensors 106 in a direction between the image sensors. Therefore, the airflow 301 that passes over the image processing element 109 is formed not to overlap 303, which is airflow that passes over the image sensors 106. In the case of the above element disposition, the airflow 301 that passes the heat dissipating part 120 formed on the casing 105 is separated from the airflow 303 that passes over the image sensors 106.

The power consumption of the image processing element 109 arranged on the image processing substrate 108 is larger than the power consumption of the image sensor 106, and there is a tendency that the amount of heat generated increases due to high functionality of the stereo camera 101.

In the case of the stereo camera of the present example, the airflow 301 that passes the heat dissipating part 120 is separated from the airflow 303 that passes over the image sensor 106. With the aforementioned structure, the heat from the image processing element 109 is released to the upper surface of the casing 105 through the heat dissipating part 120 and is dissipated to the outside by the airflow 301 in a path not passing the vicinity of the image sensor 106, and it is possible to suppress an increase in temperature of the image sensor 106.

With the structure described above, it is possible to provide the stereo camera 101 in which the image processing element 109 in the stereo camera 101 can effectively be cooled and the influence on an increase in temperature of the image sensor 106 due to the heat of the plurality of image processing elements 109 can be reduced.

Second Embodiment

Figure 13:
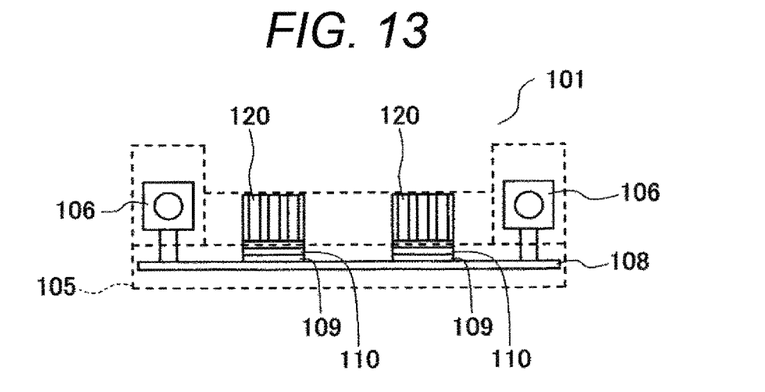
FIG. 13 is a front view transparently illustrating a casing of a stereo camera according to a second embodiment.

FIG. 13 illustrates an internal configuration of the stereo camera 101 of a second example when viewed from the front side with the casing 105 being transparent. The casing 105 is transparently illustrated and indicated by the dotted line.

FIG. 13 illustrates the stereo camera 101 of Example 2 in which the disposition of the heat dissipating part 120 illustrated in FIG. 12 is adjusted and disposed such that the heat amount of each element is planned to be equivalent right and left.

When the temperature of the right and left sides of the stereo camera 101 is increased non-uniformly due to the heat of the image processing elements 109 inside, there is a possibility that an optical axis misalignment occurs between the image sensors 106 due to a difference in deformation amount of the right and left sides of the casing because of local expansion of the image processing substrate 108, resulting in inaccuracy of detected image data or the like. Accordingly, when the image processing elements 109 and the heat dissipating parts 120 are bisymmetrically disposed as illustrated in FIG. 13, the non-uniformity of an increase in temperature on the right and left sides due to heat of the image processing elements 109 inside is corrected, and symmetric deformation enables a reduction of optical axis misalignment and acquisition of more correct data.

Third Embodiment

Figure 14:
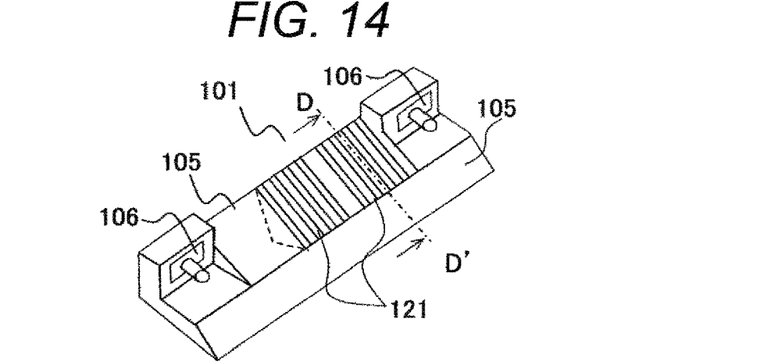
FIG. 14 is a perspective view illustrating an external appearance of the stereo camera according to a third embodiment.
Figure 15:
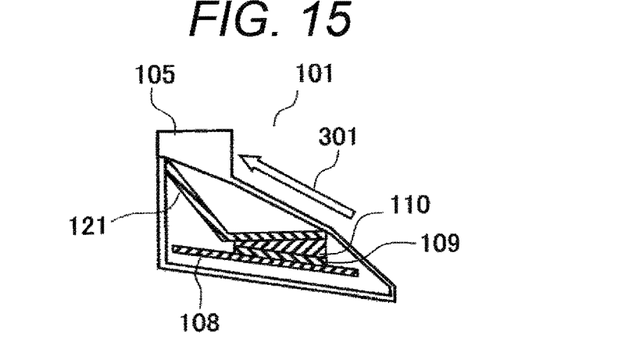
FIG. 15 is a cross-sectional view cut along D-D' of FIG. 14.

FIG. 14 illustrates a perspective view of the stereo camera 101 of a third example, and FIG. 15 illustrates D-D' cross-sectional view, which is a cross-section of the heat dissipating part 121.

As illustrated in the perspective view of FIG. 14, in the case of the stereo camera 101 of the third example, the heat dissipating part 121 is extended to the back surface of the casing 105.

As illustrated in D-D' cross-sectional view of FIG. 15, similar to Example 1, it is structured such that a plurality of image processing-grade elements 109 is mounted on the image processing substrate 108 incorporated into the camera casing 105 and is connected to the heat dissipating part 121 and the casing 105 via the heat transfer member 110, and the heat of the image processing-grade elements 109 is dissipated.

The heat dissipating part 121 of Example 3 has a structure in which the fin of the heat dissipating part 121 is extended to the back surface of the casing 105 such that the airflow 301 described in Example 1 smoothly flows along the heat dissipating part 121. With the aforementioned structure, the flow path resistance can be reduced and the flow speed of the airflow 301 can be increased. Accordingly, the cooling efficiency of the stereo camera 101 can be increased.

Fourth Embodiment

Figure 16:
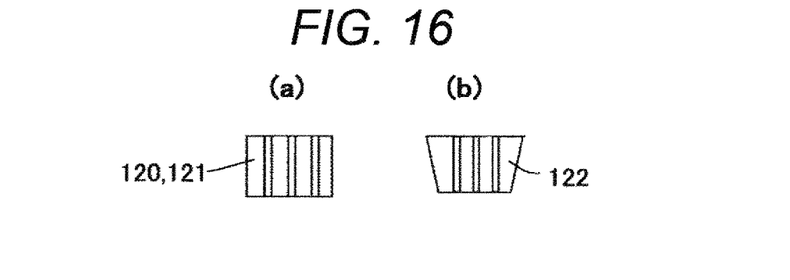
FIG. 16 is a top view explaining a heat dissipating part according to a fourth embodiment.

FIG. 16 illustrates top views of (a) the heat dissipating parts 120 and 121 of Examples 1 and 3 and (b) a heat dissipating part 122 of Example 4 of the stereo camera 101.

As illustrated in FIG. 16, in Examples 1 and 3, (a) the heat dissipating parts 120 and 121 have the same width on the windshield side and the rear glass side, whereas (b) the heat dissipating part 122 of Example 4 has a flared shape in which the width on the rear glass side is larger than the width on the windshield side. With the structure of the aforementioned heat dissipating part 122, the flow path resistance is reduced and the flow speed of the airflow 301 can be increased. Accordingly, it is possible to further increase the cooling efficiency of the stereo camera 101.

Fifth Embodiment

Figure 17:
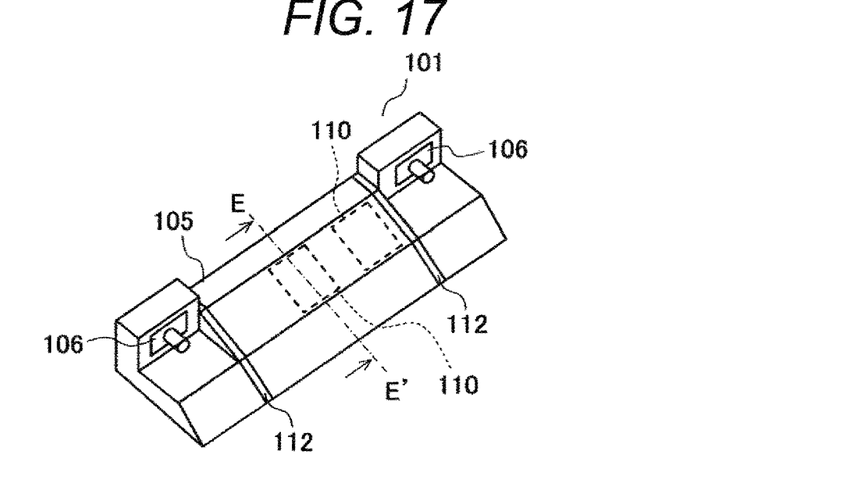
FIG. 17 is a perspective view explaining a heat insulating member according to a fifth embodiment.
Figure 18:
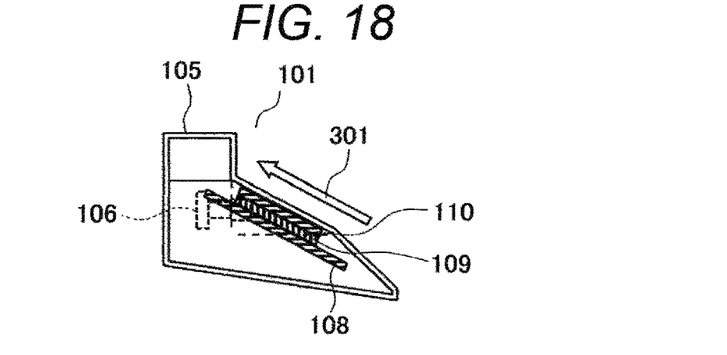
FIG. 18 is a cross-sectional view cut along E-E' of FIG. 17.

FIG. 17 illustrates a perspective view of the stereo camera 101 of Example 5, and FIG. 18 illustrates E-E' cross-sectional view, which is a cross-section at the center of the casing 105.

In the case of the stereo camera 101 of Example 5, similar to Example 1, a pair of image sensors 106 is arranged on the right and left of the casing 105, the image processing substrate 108 is arranged between the image sensors 106, and a plurality of image processing-grade elements 109 is mounted on the substrate 108.

The image processing substrate 108 of Example 5 has a structure such that, as illustrated in E-E' cross-sectional view of FIG. 18, the inclined surface of the casing 105, which is a surface facing the windshield, and the image processing substrate 108 are disposed in parallel, and the image processing-grade element 109 directly contacts the inclined surface of the casing 105 via the heat transfer member 110, e.g., a heat transfer gel or a heat transfer sheet.

With the aforementioned structure, it is structured such that the heat of the image processing 109 is transferred to the casing 105 and is dissipated to the airflow 301 even without the heat dissipating part 120 illustrated in Example 1.

In addition, the heat released to the casing 105 and transferred to the image sensor 106 causes an increase in temperature of the image sensor 106. Therefore, as a member that prevents the heat from being transferred to the image sensor 106, a heat insulating member 112, e.g., a heat insulating sheet, that separates a central part of the casing 105 from a surrounding part of the right and left image sensors 106, is arranged on the casing 105 illustrated in FIG. 17. When the heat insulating member 112 is arranged, the heat of the image processing-grade element 109 is prevented from transferring to the image sensors 106, and it is possible to prevent an increase in temperature of the image sensors 106.

Sixth Embodiment

Figure 19:
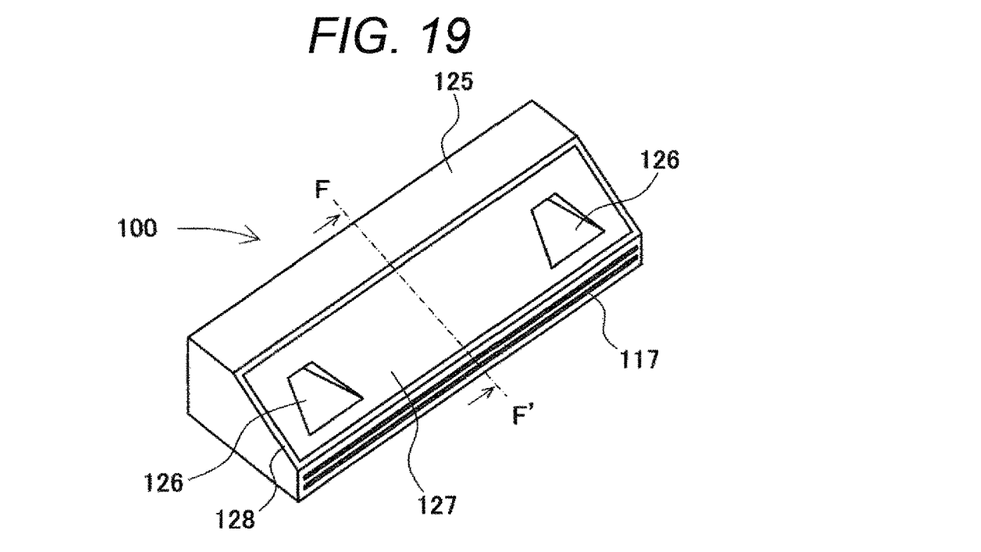
FIG. 19 is a perspective view schematically illustrating an overall configuration of a stereo camera according to a sixth embodiment.
Figure 20:
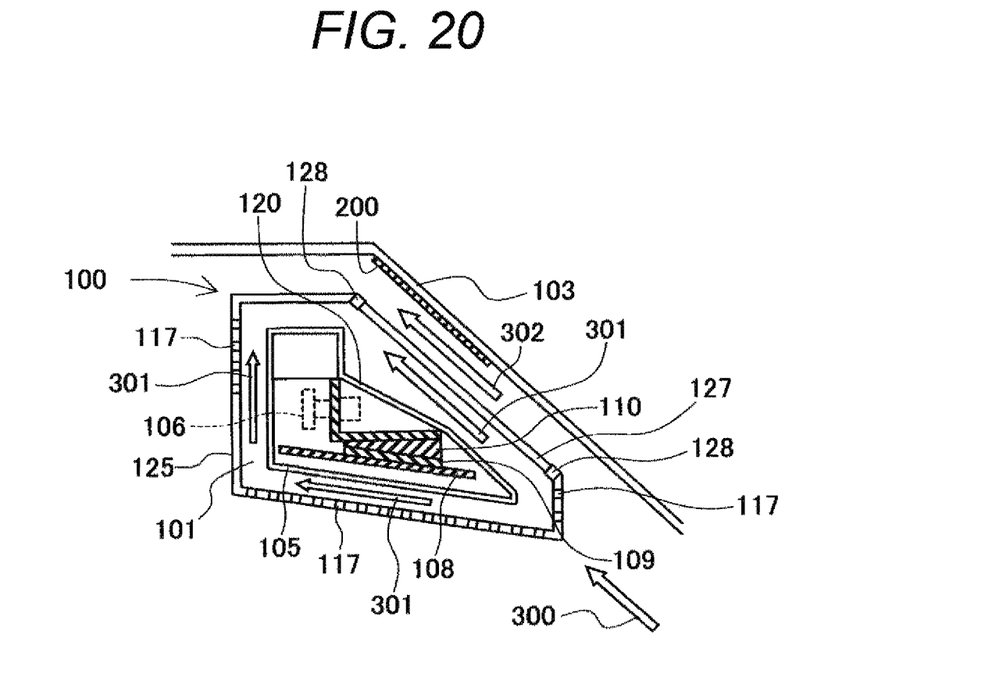
FIG. 20 is an explanatory view illustrating a cross-sectional view cut along F-F' of FIG. 19 together with a configuration of a vehicle on which the stereo camera is mounted.

FIG. 19 illustrates the cover member 125 of the stereo camera 100 of a sixth example. The cover member 125 of FIG. 19 is formed of a light shielding member 127, which is a separate member, only at an upper surface part, which is a surface facing the windshield. FIG. 19 illustrates a perspective view of the cover member 125, and FIG. 20 illustrates F-F' cross-sectional view at the center of the cover member 125.

As illustrated in the perspective view of FIG. 19, the cover member 125 of Example 6 is formed of the light shielding member 127, which is a separate member, only at an upper surface, and includes an aperture 126.

As described above, when a vehicle is parked under blazing sun in summertime, a part near an upper part of the windshield is measured to have very high temperatures. Under such a situation, it is important to protect the stereo camera 101 from solar radiation heat to ensure normal operation and reliability. Therefore, the cover member 125 of Example 6 includes the light shielding member 127, which is formed of a separate member having a high heat insulation property, and is arranged on an upper surface part of the cover member 125, as illustrated in the cross-sectional view of FIG. 20, and it is possible to effectively protect the stereo camera 101 from solar radiation heat.

Furthermore, when the light shielding member 127 is attached to the cover member 125, a position adjustment mechanism 128 that can adjust a distance between the light shielding member 127 and an upper surface of the casing 105 of the stereo camera 101 is arranged and performs adjustment. Thus, it is possible to set the airflows 301 and 302 that are optimum for cooling, and it is possible to effectively reduce an increase in temperature of the stereo camera 101.

REFERENCE SIGNS LIST 100 stereo camera and cover member
101 stereo camera
102 vehicle
103 windshield
115, 125 cover member
105 casing
106 image sensor
108 image processing substrate
109 image processing element
110 heat transfer member
112 heat insulating member
120, 121, 122 heat dissipating part
116, 126 aperture
117 slit
127 light shielding member
128 position adjustment mechanism
200 light shielding film
300 air in car
301, 302, 303 airflow

The invention claimed is:

1. A stereo camera comprising:
a pair of image sensors disposed at a same height with a space therebetween;
image processors that are disposed between the image sensors and configured to process image signals captured by the image sensors;
a casing that has the image processors and the image sensors incorporated therein, the image processors being disposed in a center portion of the casing between the pair of image sensors, the center portion between the image sensors having an inclined surface that is inclined from the image sensors downward toward an imaging direction of the image sensors;
an airflow path in which a first part of the airflow path is formed between the inclined surface of the casing and the cover member, the first airflow path defined so as to extend along the inclined surface of the casing toward the imaging direction; and
a plurality of heat dissipating parts that are thermally connected to, and disposed on, respective image processors, the plurality of heat dissipating parts being integrally formed with, and partially exposed from, an upper inclined surface of the casing so as to face the airflow path such that heat from the image processors is releasable via the upper inclined surface of the casing through the plurality of heat dissipating parts,
wherein the casing is covered with a cover member having a plurality of apertures and is disposed in a vicinity of a windshield of a vehicle,
wherein the cover member comprises a first aperture on a surface of the cover member which is arranged to face the windshield of the vehicle, the first aperture being arranged to permit capturing of image data, and
wherein the cover member comprises a second aperture formed as a first slit and a third aperture formed as a second slit, the first slit and the second slit being configured to permit airflow from outside the cover member to pass the plurality of heat dissipating parts and through the first and second slits for cooling.

2. The stereo camera according to claim 1, wherein at least one of the image processors is disposed on an inner side relative to the image sensors in a direction between the image sensors.

3. The stereo camera according to claim 1, wherein a heat transfer member is provided at a contact portion between at least one of the image processors and at least one of the heat dissipating parts.

4. The stereo camera according to claim 1, wherein at least one of the heat dissipating parts has a fin structure that is provided along the airflow path.

5. The stereo camera according to claim 1, wherein airflow that passes at least one of the heat dissipating parts is separated from airflow that passes over at least one of the image sensors.

6. The stereo camera according to claim 1, wherein the inclined surface on which at least one of the heat dissipating parts is arranged includes a recessed portion at which a portion of the casing is closer to at least one of the image processors than another portion of the casing.

7. The stereo camera according to claim 6, wherein the inclined surface is extended to a casing part on a back surface of at least one of the image sensors, and at least one of the heat dissipating parts, which is disposed at the recessed portion, is formed across the entire inclined surface.

8. The stereo camera according to claim 7, wherein the at least one of the heat dissipating parts at the recessed portion is formed to have a width that widens from below the inclined surface to above the inclined surface.

9. The stereo camera according to claim 1, wherein a heat insulating member that separates the center portion of the casing from a surrounding part of right and left image sensors is arranged on the casing.

10. The stereo camera according to claim 1, wherein a light shield is formed on the surface of the cover member facing the windshield.

11. The stereo camera according to claim 10, wherein a second part of the airflow path is formed between the light shield and the windshield.

12. The stereo camera according to claim 10, wherein a position adjustment mechanism is arranged on the cover member and configured to permit adjustment of a distance between the light shield and an upper surface of the casing.

13. The stereo camera according to claim 1, wherein the surface of the cover member is configured to protect the image sensors from heat generated by a light shield film comprising black ceramic provided on the windshield.

14. The stereo camera according to claim 1, wherein the first slit has a smaller area than the second slit.

* * * * *